(12) United States Patent
Sayers

(10) Patent No.: US 7,924,189 B2
(45) Date of Patent: Apr. 12, 2011

(54) METHOD AND APPARATUS FOR ANALOGUE TO DIGITAL CONVERSION

(75) Inventor: Anthony Sayers, Crawley (GB)

(73) Assignee: NXP B.V., Eindhoven (NL)

(*) Notice: Subject to any disclaimer, the term of this patent is extended or adjusted under 35 U.S.C. 154(b) by 21 days.

(21) Appl. No.: 11/577,317

(22) PCT Filed: Oct. 14, 2005

(86) PCT No.: PCT/IB2005/053375
§ 371 (c)(1),
(2), (4) Date: Apr. 13, 2007

(87) PCT Pub. No.: WO2006/040742
PCT Pub. Date: Apr. 20, 2006

(65) Prior Publication Data
US 2008/0055130 A1 Mar. 6, 2008

(30) Foreign Application Priority Data
Oct. 16, 2004 (GB) .................................. 0423011.6

(51) Int. Cl.
*H03M 1/00* (2006.01)
(52) U.S. Cl. .......................................... 341/139; 341/155
(58) Field of Classification Search .................. 341/139, 341/155, 143, 144, 156
See application file for complete search history.

(56) References Cited

U.S. PATENT DOCUMENTS

| 5,465,092 | A | * | 11/1995 | Mayes et al. | 341/118 |
| 6,317,065 | B1 | | 11/2001 | Raleigh et al. | |
| 6,377,196 | B1 | * | 4/2002 | Kolsrud et al. | 341/118 |
| 6,407,689 | B1 | * | 6/2002 | Bazarjani et al. | 341/143 |
| 6,473,013 | B1 | * | 10/2002 | Velazquez et al. | 341/120 |
| 6,538,592 | B1 | * | 3/2003 | Yang et al. | 341/155 |
| 6,784,820 | B1 | * | 8/2004 | Casalegno et al. | 341/155 |
| 6,822,595 | B1 | * | 11/2004 | Robinson | 341/144 |
| 6,965,658 | B1 | * | 11/2005 | Lindqvist et al. | 375/347 |
| 6,977,502 | B1 | * | 12/2005 | Hertz | 324/318 |
| 7,006,028 | B2 | * | 2/2006 | Galton | 341/155 |
| 2006/0267812 | A1 | * | 11/2006 | Bunin | 341/120 |

FOREIGN PATENT DOCUMENTS

| EP | 0856947 A | 8/1998 |
| JP | 01137832 A | 5/1989 |
| JP | 10209868 A | 11/1998 |

* cited by examiner

*Primary Examiner* — Joseph Lauture

(57) ABSTRACT

An analogue to digital conversion unit (208, 210) comprises three analogue to digital converters (ADCs) (300, 301, 302) having different dynamic ranges. A lowest dynamic range ADC (300) and middle dynamic range ADC (301) have saturation detectors SAT for outputting a signal when the amplitude of an input analogue signal reaches their respective dynamic ranges and saturates them. The middle dynamic range ADC (301) and highest dynamic range ADC have enable inputs EN for switching themselves on. The output of the saturation detector SAT of the lowest dynamic range ADC (300) is connected to the enable input EN of the middle dynamic range ADC (301). The output of the saturation detector SAT of the middle dynamic range ADC (301) is connected to the enable input EN of the highest dynamic range ADC (302). So, whilst the middle and the highest dynamic range ADCs (301, 302) are normally switched off, when the lowest dynamic range ADC becomes saturated, the middle dynamic range ADC (301) is switched on; and when the middle dynamic range ADC (301) is saturated, the highest dynamic range ADC (302) is switched on. The input analogue signal is therefore converted to a digital output using the ADC (300, 301, 302) having the lowest sufficient dynamic range and the higher dynamic range ADCs (301, 302) are switched off unless needed.

30 Claims, 3 Drawing Sheets

METHOD AND APPARATUS FOR ANALOGUE TO DIGITAL CONVERSION

This invention relates to a method and apparatus for analogue to digital conversion. A particular, but not exclusive, application of the invention is analogue to digital conversion of a radio signal in a digital radio receiver.

Analogue to digital conversion basically involves expressing an input analogue signal, which may vary with time over a continuous range of amplitudes, as a series of discrete values, which can be referred to as output codes and are usually expressed in binary form. Different analogue to digital converters (ADCs) for performing analogue to digital conversion have different characteristics. For example, the number of bits that an ADC uses defines the number of different output codes that it can output and is known as the ADC's resolution. An ADC having a resolution of N bits can output $2^N$ different output codes. Similarly, the voltage of the input analogue signal represented by the least significant bit (LSB) of the ADC is the smallest difference in input analogue amplitude that can be expressed by the ADC. The resolution of the ADC and the value of its LSB define the range of input analogue amplitudes that the ADC is able to express. This range is known as the ADC's dynamic range and is usually expressed in dB.

Selecting an ADC for a particular application requires careful selection of these different characteristics. In particular, it is necessary for an ADC to have a sufficiently large dynamic range to handle the maximum range of amplitudes that the input analogue signal is expected to have. Referring to FIG. 1, an analogue signal input to the ADC of a receiver in a radio communications system typically comprises a wanted signal 100 and a possible interferer 101. The wanted signal 100 tends to have roughly constant maximum amplitude. However, sometimes the possible interferer can be significantly larger in amplitude than the wanted signal, as shown in FIG. 1, and at other times the interferer may be small or even insignificant in comparison to the amplitude of the wanted signal. In order to ensure that the wanted signal can always be extracted after analogue to digital conversion, the dynamic range of the ADC should be large enough to always be able to convert the whole expected signal, e.g. both the wanted signal and the possible interferer, even when the interferer is large. A fairly large dynamic range in comparison to the usual maximum amplitude of the wanted signal therefore tends to be required. However, much of the time, e.g. when the possible interferer is small, this large dynamic range is not used or needed.

Another feature of ADCs is that their power consumption increases strongly with dynamic range. Indeed, power consumption increases roughly linearly with dynamic range, meaning, for example, that an ADC having a dynamic range of 0 to 80 dB has power consumption around a factor of 100 greater than that of an ADC having a dynamic range of 0 to 60 dB. Typically, the power consumption of an ADC is governed by the power consumption of its sample and hold amplifier (SHA), which is usually a class A amplifier having a quiescent current equal to the maximum current that it produces. This means that the ADC has roughly constant power consumption, regardless of whether or not the analogue signal input to the ADC has a small amplitude or an amplitude close to the dynamic range of the ADC at any particular time. In other words, the power consumption of the ADC is governed by the maximum expected amplitude of the input analogue signal, even when it is expected that the input analogue signal will have a smaller amplitude much of the time. This excessive power consumption is generally undesirable and, indeed, can be a serious drawback when an ADC is incorporated in a battery operated device.

The present invention seeks to overcome this problem.

According to a first aspect of the present invention, there is provided an apparatus for converting an input analogue signal to a digital output, the apparatus comprising:

two or more analogue to digital converters having different dynamic ranges; and an activation circuit for activating a first of the analogue to digital converters having a higher dynamic range than a second of the analogue to digital converters when the input analogue signal has an amplitude exceeding a threshold level.

Also, according to a second aspect of the present invention there is provided a method of converting an input analogue signal to a digital output using two or more analogue to digital converters having different dynamic ranges, the method comprising:

activating a first of the analogue to digital converters having a higher dynamic range than a second of the analogue to digital converters when the input analogue signal has an amplitude exceeding a threshold level.

Whilst the amplitude of the input analogue signal is below the threshold level, the second analogue to digital converter can convert the signal to a digital output and the first analogue to digital converter can remain deactivated. However, when the input analogue signal has an amplitude greater than the threshold level, the first analogue to digital converter can be activated. The second analogue to digital converter typically has a smaller power consumption than the first analogue to digital converter, as the second analogue to digital converter has a lower dynamic range than the first analogue to digital converter. This means that the apparatus and method of the invention can reduce the power consumption of analogue to digital conversion whenever the amplitude of the input analogue signal is lower than the threshold level.

Conveniently, the threshold level can be substantially the amplitude at which the second analogue to digital converter becomes saturated by the input analogue signal. The second analogue to digital converter can therefore convert the input analogue signal whilst the amplitude of the signal remains within its dynamic range and the first analogue to digital converter can be activated to convert the signal when the amplitude of the signal exceeds the dynamic range of the second analogue to digital converter. The first analogue to digital converter can therefore be activated only when it is needed.

Activating the first ADC may possibly take a short time. In another example, the threshold level may therefore be a fraction below the amplitude at which the second analogue to digital converter becomes saturated by the input analogue signal. This can allow the first ADC to be activated to convert the signal slightly before the amplitude of the signal reaches the dynamic range of the second ADC, even if the amplitude of the signal rises quickly. Consequently, an unsaturated digital output should be continuously available. Typically, the fraction is around 20% or less, e.g. around 6 dB for a dynamic range of around 0 to 43 dB or 0 to 63 dB.

Usefully, the activation circuit can comprise a detector for detecting when the input analogue signal has an amplitude exceeding the threshold level and generating a signal indicative of such detection. Likewise, the method can comprise detecting when the input analogue signal has an amplitude exceeding the threshold level and generating a signal indicative of such detection. The first analogue to digital converter may have an enable input for receiving a signal to activate the converter. The converter may be activated only whilst it receives a signal at the enable input. In particular, the activation circuit may comprise a connection directly from the detector to the enable input so that the signal generated by the detector can activate the converter. Likewise, the method may comprise outputting the signal indicative of the detection directly to the enable input so that the signal can activate the converter. This is particularly straightforward and convenient, as it requires little processing or circuitry to implement.

Alternatively, the activation circuit may comprise a controller for outputting the enable signal to the enable input of the first analogue to digital converter. The controller can be connected to receive the signal generated by the detector and can output the enable signal from whenever the signal generated by the detector indicates that the input analogue signal has an amplitude exceeding a threshold level until the controller determines that the amplitude of the input analogue signal is small enough to be converted to a digital output by the second analogue to digital converter without saturation. Likewise, the method may comprise outputting the enable signal to the enable input of the first analogue to digital converter from whenever the generated signal indicates that the input analogue signal has an amplitude exceeding the threshold level until determining that the amplitude of the input analogue signal is small enough to be converted to a digital output by the second analogue to digital converter without saturation. This is useful, as it allows deactivation of the first analogue to digital converter to be based on a determination of the amplitude of the input analogue signal, e.g. over a period of time or with reference to another threshold level.

Indeed, in another example, the controller may output the enable signal to the enable input of the first analogue to digital converter whenever the signal generated by the detector indicates that the input analogue signal has an amplitude exceeding a threshold level and for a period of time after the signal generated by the detector ceases to indicate that the input analogue signal has an amplitude exceeding a threshold level. Likewise, the method may comprise outputting the enable signal to the enable input of the first analogue to digital converter whenever the generated signal indicates that the input analogue signal has an amplitude exceeding a threshold level and for a period of time after the generated signal ceases to indicate that the input analogue signal has an amplitude exceeding the threshold level. This means that when the amplitude of the input analogue signal falls below the threshold level only for a time shorter than the period, the first analogue to digital converter remains activated. So, short dips in the amplitude of the input analogue signal need not result in the first analogue to digital converter being deactivated and then quickly reactivated again.

The invention is applicable to analogue to digital conversion units having various different architectures. However, in a preferred example, the first analogue to digital converter has a higher resolution than the second analogue to digital converter. The apparatus typically has a selector for selecting an output of an activated one of the analogue to digital converters having the highest dynamic range as the digital output of the apparatus. Likewise, the method may comprise selecting an output of an activated one of the analogue to digital converters having the highest dynamic range as the digital output of the apparatus. So, the digital output of the apparatus can solely comprise the digital output of a selected one of the analogue to digital converters.

In another example, the apparatus may be a multi-stage pipelined analogue to digital conversion unit. For example, both/all of the digital to analogue converters may have substantially the same resolution. Similarly, the apparatus may comprise a combining circuit for combining the outputs of the activated analogue to digital converters as the digital output of the apparatus. Likewise, the method may comprise combining the outputs of the activated analogue to digital converters as the digital output.

The preferred features of the invention have been described in relation to just first and second, i.e. two, analogue to digital converters. However, the principles of the invention can be extended to any number of analogue to digital converters. In particular, the apparatus may comprise a third analogue to digital converter having a lower dynamic range than the second analogue to digital converter and wherein the activation circuit is arranged to activate the second analogue to digital converter when the input analogue signal has an amplitude exceeding another threshold level. Likewise, the method may use a third analogue to digital converter having a lower dynamic range than the second analogue to digital converter and comprise activating the second analogue to digital converter when the input analogue signal has an amplitude exceeding another threshold level. The other threshold level would usually be lower than the threshold level mentioned previously, but the second analogue to digital converter can be activated in an otherwise analogous way to the first analogue to digital converter.

It can be appreciated that the invention can be implemented by computer software. According to a third aspect of the present invention, there is therefore provided computer software or computer program code adapted to carry out the method described above when processed by a computer. The computer software or computer program code can be carried by computer readable media. The media may be a physical storage media such as a Read Only Memory (ROM) chip. Alternatively, it may be a disk such as a Digital Video Disk (DVD-ROM) or Compact Disk (CD-ROM). It could also be a signal such as an electronic signal over wires, an optical signal or a radio signal such as to a satellite or the like. The invention also extends to a computer running the software or code, e.g. a computer configured to carry out the method described above.

According to a fourth aspect of the invention there is provided a radio receiver comprising the apparatus according to the first aspect of the invention.

Preferred embodiments of the invention will now be described, by way of example only, with reference to the accompanying drawings, in which.

Figure 1:
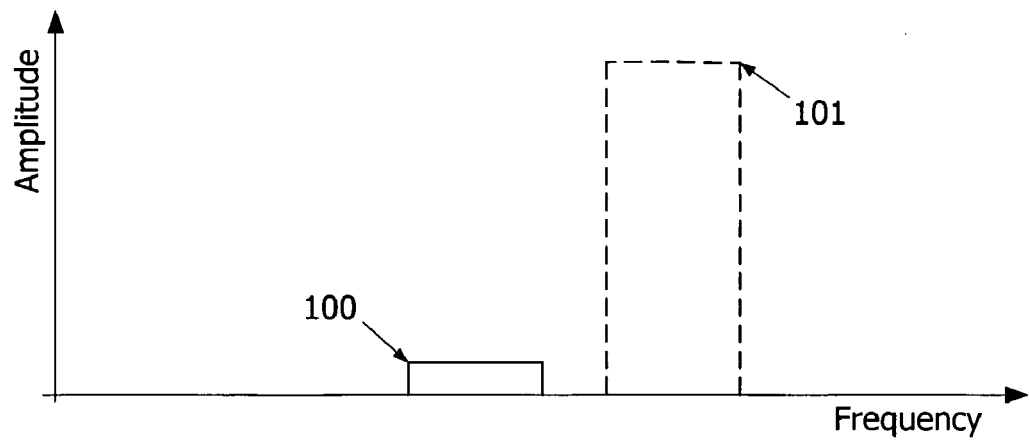
FIG. 1 is a graphical representation of a radio signal received by a radio receiver.
Figure 2:
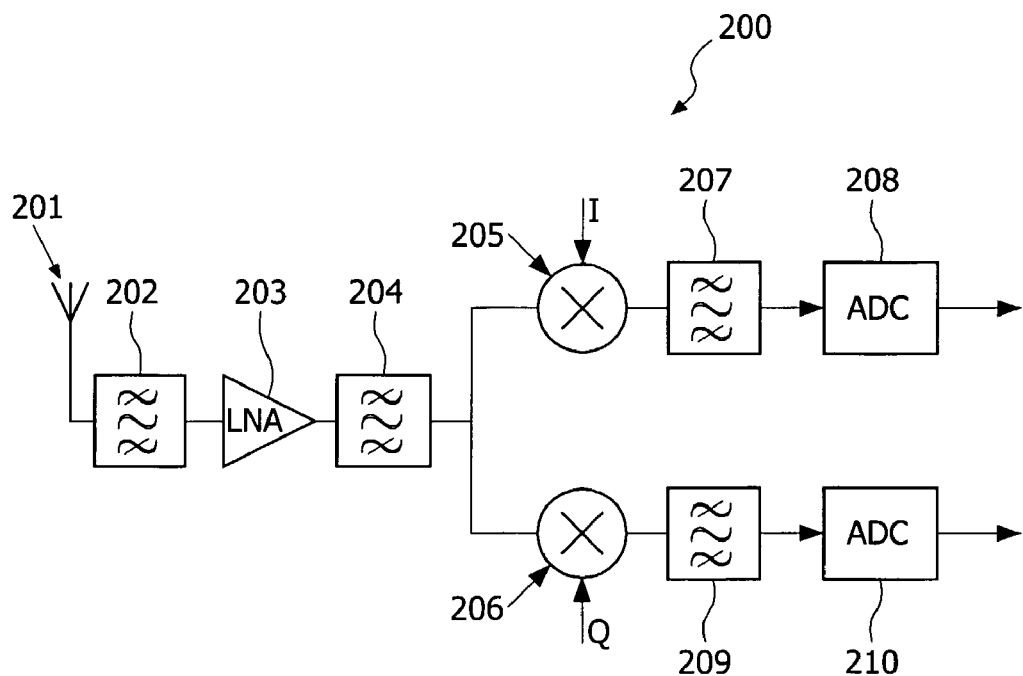
FIG. 2 is a schematic illustration of a radio receiver.

Referring to FIG. 2, a radio receiver 200 has an antenna 201 for receiving a radio signal modulated using a Quadrature Phase-Shift Keying (QPSK) modulation scheme. The output of the antenna 201 is connected to a first filter 202 for filtering the signal; the output of the first filter 202 is connected to a low noise amplifier (LNA) 203 for amplifying the signal; and the output of the LNA 203 is connected to a second filter 204 for filtering the signal again. So, the signal received by the antenna 201 can be filtered, amplified and filtered again to produce a filtered, amplified signal.

The output of the second filter 204 is connected to I and Q mixers 205, 206 for mixing the filtered, amplified signal down to I and Q baseband signals. More specifically, an I mixer 205 can mix the signal down to a baseband signal representing I information and a Q mixer 206 can mix the signal down to a baseband signal representing Q information. The output of the I mixer 205 is connected to a third filter 207, which in turn is connected to an analogue to digital conversion unit (ADC unit) 208 for converting the filtered I signal, which is an analogue signal, into a digital output. Similarly, the output of the Q mixer 206 is connected to a fourth filter 209, which in turn is connected to another ADC unit 210 for converting the filtered Q signal, which is an analogue signal, into a digital output. The third and fourth filters 207, 209 and the two ADC units 208, 210 are identical in this embodiment of the invention.

Figure 3:
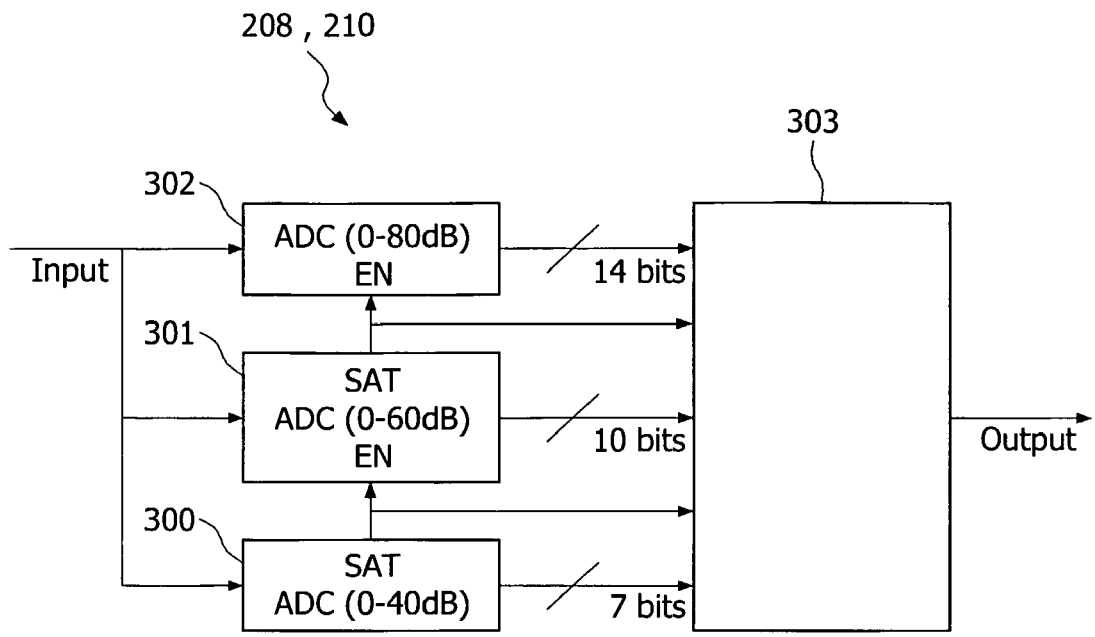
FIG. 3 is a schematic illustration of a first embodiment of an analogue to digital conversion unit of the radio receiver illustrated in FIG. 2.

Referring to FIG. 3, in a first embodiment, the ADC units 208, 210 each comprise three analogue to digital converters (ADCs) 300, 301, 302 connected to receive the analogue signal input to the ADC unit 208, 210 from the respective filters 207, 209. A lowest dynamic range ADC 300 has an input dynamic range of around 0 to 40 dB and a resolution of 7 bits; a middle dynamic range ADC 301 has an input dynamic range of around 0 to 60 dB and a resolution of 10 bits; and a highest dynamic range ADC 302 has an input dynamic range of around 0 to 80 dB and a resolution of 14 bits. The ADC unit 208, 210 also has a digital recombination device 303 for receiving the digital outputs of the ADCs 300, 301, 302 and selecting one of the outputs of the ADCs 300, 301, 302 as the output of the ADC unit 208, 210.

The lowest dynamic range ADC 300 and the middle dynamic range ADC 301 each have a saturation detector SAT for detecting when the amplitude of the input analogue signal reaches the dynamic range of the respective ADC 300, 301. This is achieved by the saturation detectors SAT being able to detect when the bits output by the ADCs 300, 301 are either all ones or all zeros, e.g. 1111111 or 0000000, which is indicative of the ADCs 300, 301 becoming saturated by the input analogue signal. More specifically, the saturation detector SAT of the lowest dynamic range ADC 300 detects when the input analogue signal reaches 40 dB and the saturation detector SAT of the middle dynamic range ADC 301 detects when the input analogue signal reaches 60 dB. Upon these respective detections, each of the saturation detectors SAT are arranged to output a saturation signal.

The middle dynamic range ADC 301 and the highest dynamic range ADC 302 each have an enable input EN for switching on the ADCs 201, 202. The saturation detector SAT of the lowest dynamic range ADC 300 is connected to the enable input EN of the middle dynamic range-ADC 301. This means that, when the saturation signal is output by the saturation detector SAT of the lowest dynamic range ADC 300, it is received by the enable input EN of the middle dynamic range ADC 301. This switches on the middle dynamic range ADC 301. Conversely, when the saturation signal is not (or is no longer) received from the saturation detector SAT of the lowest dynamic range ADC 300, the middle dynamic range ADC 301 is turned off.

Similarly, the saturation detector SAT of the middle dynamic range ADC 301 is connected to the enable input EN of the highest dynamic range ADC 302. This means that, when the saturation signal is output by the saturation detector SAT of the middle dynamic range ADC 301, it is received by the enable input EN of the highest dynamic range ADC 302. This switches on the highest dynamic range ADC 302. Again, conversely, when the saturation signal is not (or is no longer) received from the saturation detector SAT of the middle dynamic range ADC 301, the highest dynamic range ADC 302 is turned off.

The outputs of the saturation detectors SAT of the lowest dynamic range ADC 300 and the middle dynamic range ADC 301 are also connected to the digital recombination device 303. So, the saturation signals output by the saturation detectors SAT are received by the digital recombination device 303, informing it when the middle dynamic range ADC 301 and highest dynamic range ADC 302 are switched on.

In use, whenever power is supplied to the ADC units 208, 210, the lowest dynamic range ADC 300 is switched on, but the middle dynamic range ADC 301 and highest dynamic range ADC 302 are initially switched off. The lowest dynamic range ADC 300 therefore converts the input analogue signal to a digital output, which is passed to the digital recombination device 303. The saturation detector SAT of the lowest dynamic range ADC 300 monitors the digital output of the ADC 300 and detects when the output of the ADC 300 indicates that amplitude of the input analogue signal reaches 40 dB. Upon this detection, the saturation detector SAT outputs the saturation signal to the enable input EN of the middle dynamic range ADC 301. The saturation signal therefore switches on the middle dynamic range ADC 301 to convert the input analogue signal to a digital output, which is passed to the digital recombination device 303. If the amplitude of the input analogue signal subsequently decreases below 40 dB, the saturation signal to the enable input EN of the middle dynamic range ADC 301 ceases and the middle dynamic range ADC 301 is turned off.

Similarly, when the middle dynamic range ADC is operating, the saturation detector SAT of the middle dynamic range ADC 301 detects when the output of the ADC 301 indicates that the amplitude of the input analogue signal reaches 60 dB. Upon this detection, the saturation detector SAT outputs the saturation signal to the enable input EN of the highest dynamic range ADC 302. The saturation signal therefore switches on the highest dynamic range ADC 302 to convert the input analogue signal to a digital output, which is passed to the digital recombination device 303. If the amplitude of the input analogue signal subsequently decreases below 60 dB, the saturation signal to the enable input EN of the highest dynamic range ADC 302 ceases and the highest dynamic range ADC 302 is turned off.

The digital recombination device 303 receives the digital outputs of all of the ADCs 300, 301, 302 and the saturation signals SAT of the saturation detectors SAT of the lowest dynamic range ADC 300 and the middle dynamic range ADC 301. When the digital recombination device 303 receives no saturation signal, it selects the digital output of the lowest dynamic range ADC 300 as the output of the ADC unit 208, 210; when the digital recombination device 303 receives a saturation signal from the lowest dynamic range ADC 300, but not from the middle dynamic range ADC 301, it selects the digital output of the middle dynamic range ADC 301 as the output of the ADC unit 208, 210; and when the digital recombination device 303 receives a saturation signal from the lowest dynamic range ADC 300 and from the middle dynamic range ADC 301, it selects the digital output of the highest dynamic range ADC 302 as the output of the ADC unit 208, 210. So, at any time, the output of the ADC unit 208, 210 is the digital output of the ADC 300, 301, 302 having the least possible dynamic range required to convert the input analogue signal to a digital output. The highest dynamic range ADC 302 and middle dynamic range ADC 301 are switched off when they are not needed. As the power consumption of the ADCs 300, 301, 302 increases with dynamic range, this means that power consumption of the ADC units 208, 210 is always kept to a minimum.

Figure 4:
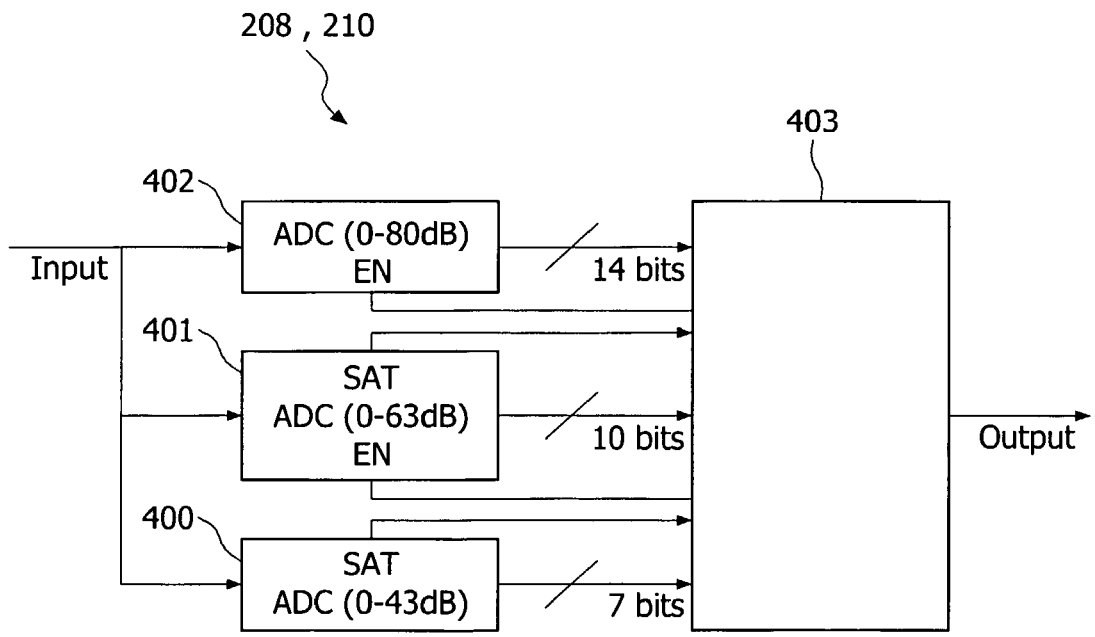
FIG. 4 is a schematic illustration of a second embodiment of an analogue to digital conversion unit of the radio receiver illustrated in FIG. 2.

Referring to FIG. 4, in a second embodiment, the ADC units 208, 210 have a basically the same arrangement as that of the first embodiment. However, the lower dynamic range ADC 400 has an input dynamic range of around 0 to 43 dB rather than 0 to 40 dB and the middle dynamic range ADC 401 has an input dynamic range of around 0 to 63 dB rather than 0 to 60 dB. Also, the saturation detector SAT of the lowest dynamic range ADC 400 and the middle dynamic range ADC 401 can detect when the amplitude of the input analogue signal comes close to reaching the dynamic range of the ADCs 400, 401. This is achieved by the saturation detectors SAT being able to detect when some higher significant bits output by the ADCs 400, 401 are either all, ones or all zeros, e.g. 1111111 or 0000000. This is indicative of the ADCs 400, 401 coming near to being saturated by the input analogue signal. More specifically, the saturation detector SAT of the lowest dynamic range ADC 400 detects when the input analogue signal reaches 37 dB and the saturation detector of the middle dynamic range ADC 401 detects when the input analogue signal reaches 57 dB. Upon these respective detections, the saturation detectors SAT are each arranged to output a saturation signal.

Rather than being connected directly to the enable inputs EN of the middle dynamic range ADC 401 and highest dynamic range ADC 402, the outputs of the saturation detectors SAT of the lowest dynamic range ADC 400 and the middle dynamic range ADC 401 are only connected to the digital recombination device 403. More specifically, the outputs are connected to an ADC controller (not shown) of the digital recombination device 403. So, the saturation signals output by the saturation detectors SAT are received by the ADC controller, informing it when the lowest dynamic range ADC 400 and middle dynamic range ADC 401 are close to saturation.

On receipt of the saturation signal from the saturation detector SAT of the lowest dynamic range ADC 400, the ADC controller is arranged to output an enable signal to the enable input EN of the middle dynamic range ADC 401. This means that, when the amplitude of the input analogue signal reaches 37 dB, an enable signal is received by the enable input EN of the middle dynamic range ADC 401, switching on the middle dynamic range ADC 401. Similarly, on receipt of the saturation signal from the saturation detector SAT of the middle dynamic range ADC 401, the ADC controller is arranged to output an enable signal to the enable input EN of the highest dynamic range ADC 402. This means that, when the amplitude of the input analogue signal reaches 57 dB, an enable signal is received by the enable input EN of the highest dynamic range ADC 202, switching on the highest dynamic range ADC 202.

Whilst the ADC controller is prompted to output the enable signal(s) to the middle dynamic range ADC 401 or the highest dynamic range ADC 402 by receipt of the saturation signal(s), it continues to output the enable signal(s) regardless of whether or not it continues to receive the saturation signal(s). The ADC controller decides when to stop outputting the enable signal(s) by monitoring the output of the middle dynamic range ADC 401 or the highest dynamic range ADC 402, as appropriate. More specifically, when the middle dynamic range ADC 401 is turned on, but the highest dynamic range ADC 402 is not, the ADC controller monitors the output of the middle dynamic range ADC 401 and stops outputting the enable signal to the middle dynamic range ADC 401 if the output of the middle dynamic range ADC 401 continues to represent an input analogue signal with an amplitude of less than 37 dB for more than a given period, e.g. a few ms. Similarly, when the highest dynamic range ADC 402 is switched on, the ADC controller monitors the output of the highest dynamic range ADC 402 and stops outputting the enable signal to the highest dynamic range ADC 402 if the output of the highest dynamic range ADC 402 continues to represent an input analogue signal with an amplitude of less than 57 dB for more than the given period. So, whilst the highest dynamic range ADC 402 and the middle dynamic range ADC 401 are switched off when they are not needed, they are only switched off when the signal has been below 57 dB or 37 dB respectively for the given period. This reduces the need to rapidly turn the ADCs 401, 402 off and back on again when the amplitude of the input analogue signal momentarily drops below 57 dB or 37 dB and then rises again.

The digital recombination device 403 selects one of the digital outputs of the ADCs 400, 401, 402 as the output of the ADC unit 208, 210 in the same way as in the first embodiment. However, it will be appreciated that whilst the middle dynamic range ADC 401 is switched on when the amplitude of the input analogue signal reaches 37 dB, the lowest dynamic range ADC 400 remains unsaturated until the amplitude of the signal reaches 43 dB. The digital recombination device 403 can therefore receive an unsaturated digital output from both the lowest dynamic range ADC 400 and the middle dynamic range ADC 401 when the amplitude of the input analogue signal is between 37 dB and 43 dB and can select the most appropriate of these two digital outputs as the output of the ADC unit 208, 210. Similarly, whilst the highest dynamic range ADC 402 is switched on when the amplitude of the input analogue signal reaches 57 dB, the middle dynamic range ADC 401 remains unsaturated until the amplitude of the signal reaches 63 dB. The digital recombination device 403 can therefore receive an unsaturated digital output from both the middle dynamic range ADC 401 and the highest dynamic range ADC 402 when the amplitude of the input analogue signal is between 57 dB and 63 dB and can select the most appropriate of these two digital outputs as the output of the ADC unit 208, 210.

For example, if the amplitude of the input analogue signal increases quickly, any short delay between the saturation detector SAT of the lowest dynamic range ADC 400 detecting that the lowest dynamic range ADC 400 is close to saturation and the digital recombination device 403 starting to receive a digital output from middle dynamic range ADC 401 can be tolerated by briefly continuing to select the (unsaturated) output of the lowest dynamic range ADC 400 as the output of the ADC unit 208, 210 until the digital output is received from the middle dynamic range ADC 401. Likewise, any short delay between the saturation detector SAT of the middle dynamic range ADC 401 detecting that the middle dynamic range ADC 401 is close to saturation and the digital recombination device 403 starting to receive a digital output from highest dynamic range ADC 402 can be tolerated by briefly continuing to select the (unsaturated) output of the middle dynamic range ADC 401 as the output of the ADC unit 208, 210 until the digital output is received from the highest dynamic range ADC 402. It is therefore less likely that the output of the ADC unit 208, 210 will ever be a saturated signal.

Figure 5:
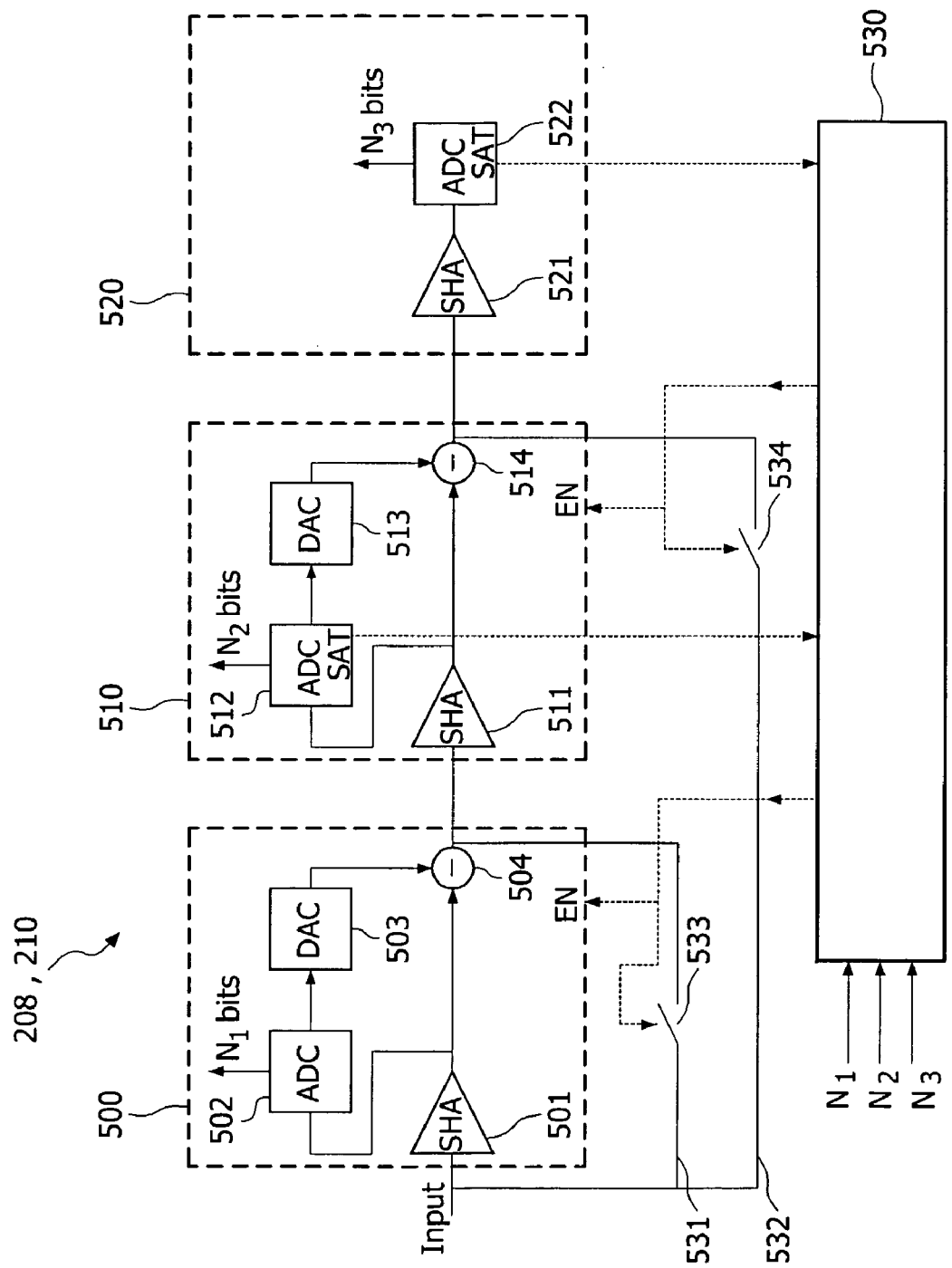
FIG. 5 is a schematic illustration of a third embodiment of an analogue to digital conversion unit of the radio receiver illustrated in FIG. 2.

In a third embodiment, the ADC units 208, 210 each comprise a multi-stage pipelined ADC unit. More specifically, referring to FIG. 5, the ADC units 208, 210 each have three ADC stages 500, 510, 520. A first ADC stage 500 comprises a sample and hold amplifier SHA 501, an ADC 502 that has an input dynamic range of around 0 to 80 dB and a resolution of 4 bits, a digital to analogue converter (DAC) 503 that has a dynamic range of around 0 to 80 dB and a resolution of 12 bits; and a subtractor 504. A second ADC stage 510 comprises an SHA 511, an ADC 512 that has an input dynamic range of around 0 to 60 dB and a resolution of 4 bits, a DAC 513 that has a dynamic range of around 0 to 60 dB and a resolution of 8 bits; and a subtractor 514. A third ADC stage 520 comprises an SHA 521 and an ADC 522 that has an input dynamic range of around 0 to 40 dB and a resolution of 4 bits. The SHAs 501, 511, 521 of each stage 500, 510, 520 are usually incorporated in the ADCs 502, 512, 522 of the respective stages 500, 510, 520, as they are a standard component of most conventional ADCs. However, they are shown separately in FIG. 5 for clarity.

The output of each SHA 501, 511, 521 is connected to the input of the ADC 502, 512, 522 of the respective ADC stage 500, 510, 520; the output of the ADCs 502, 512 of the first and second ADC stages 500, 510 are connected to the inputs of the DACs 503, 513 of the respective first and second ADC stages 500, 510; and the inputs of the subtractors 504, 514 of the first and second ADC stages 500, 510 are connected to the outputs of both the SHAs 501, 511 and DACs 503, 513 of the respective first and second ADC stages 500, 510.

The ADC stages 500, 510, 520 are connected to one another in series. So, the SHA 501 of the first stage 500 is connected to receive the input analogue signal; the output of the subtractor 504 of the first ADC stage 500 is connected to the input of the SHA 511 of the second ADC stage 510; and the output of the subtractor 514 of the second ADC stage 510 is connected to the input of the SHA 521 of the third ADC stage 520. In addition, the output of each of the ADCs 502, 512, 522 is connected to a control logic device 530.

In this embodiment, the ADC unit 208, 210 has two bypass lines 531, 532, each having a switch 533, 534 controlled by the control logic device 530. A first bypass line 531 extends from the input of the ADC unit 208, 210 to the input of the SHA 511 of the second ADC stage 510 for bypassing the first ADC stage 500. A second bypass line extends from the input of the ADC unit 208, 210 to the input of the SHA 521 of the third ADC stage 520 for bypassing both the first ADC stage 500 and the second ADC stage 510 together. The control logic device 530 is operable to open and close the switches 533, 534 to selectively bypass either the first ADC stage 500 or to bypass both the first ADC stage 500 and the second ADC stage 510 together, as desired.

Like the first and second embodiments, the ADCs 512, 522 of the second and third ADC stages 510, 520 (which have the lowest and middle dynamic ranges of the three ADCs 502, 512, 522) each have a saturation detector SAT for detecting when the ADCs 512, 522 become saturated. As in the first embodiment, this is achieved by the saturation detectors SAT being able to detect when the bits output by the ADCs 512, 522 are either all ones or all zeros, e.g. 1111111 or 0000000, which is indicative of the ADCs 512, 522 becoming saturated. Upon such detection, the saturation detectors SAT output a saturation signal to the control logic device 530.

Both the first ADC stage 500 and the second ADC stage 510 have an enable input EN for receiving an enable signal to switch on the stages 500, 510. The control logic device 530 is connected to the enable inputs EN of the first ADC stage 500 and the second ADC stage 510 so that it can output the enable signals to each of the stages 500, 510 to switch them on. The control logic device 530 is also connected to the switches 533, 534 of the bypass lines 531, 532 so that when it outputs an enable signal to the enable input EN of the first ADC stage 500, the signal is received by the switch 533 of the first bypass line 531 to open the switch 533 and disable the first bypass line 531; and when it outputs an enable signal to the enable input EN of the second ADC stage 510, the signal is received by the switch 534 of the second bypass line 532 to open the switch 534 and disable the second bypass line 532.

In use, whenever power is supplied to the ADC unit 208, 210, the SHA 521 and ADC 522 of the third ADC stage 520 are operational. Provided the amplitude of the input analogue signal is less than 40 dB, the switches 533, 534 of the bypass lines 531, 532 are closed, with the result that the analogue signal input to the ADC unit 208, 210 passes directly to the SHA 521 and ADC 522 of the third ADC stage 520 (via the second bypass line 532). The SHA 521 and ADC 522 convert the input analogue signal from analogue to digital and output the converted signal $N_3$ to the control logic device 530. However, if the amplitude of the input analogue signal reaches 40 dB, the saturation detector SAT of the ADC 522 of the third ADC stage 520 detects that the ADC 522 is saturated and outputs a saturation signal to the control logic device 530.

When the control logic device 530 receives the saturation signal from the saturation detector SAT of the ADC 522 of the third ADC stage 520, it outputs an enable signal to the enable input EN of the second ADC stage 510 and the switch 534 of the second bypass line 532. The enable signal switches on the second ADC stage 510 and opens the switch 534 of the second bypass line 532 to disable the second bypass line 532 and, provided the amplitude of the input analogue signal remains less than 60 dB so that the switch 534 of the first bypass line 531 remains closed, the input analogue signal stops passing directly to the input of the SHA 521 of the third ADC stage 520 and instead passes directly to the input of the SHA 511 of the second ADC stage 510 via the first bypass line 532. The SHA 511 and ADC 512 of the second ADC stage 510 convert the input analogue signal from analogue to digital and output the converted signal $N_2$ to the control logic device 530 and to the DAC 513. The DAC 513 converts output of the ADC 512 back to an analogue signal and outputs the reconverted analogue signal to the subtractor 514. The subtractor 514 then subtracts the reconverted analogue signal from the input analogue signal passed to it from the SHA 511. The signal resulting from the subtraction is passed to the input of the third ADC stage 520, which performs analogue to digital conversion of the signal and outputs the converted signal $N_3$ to the control logic device 530. However, if the amplitude of the input analogue signal reaches 60 dB, the saturation detector SAT of the ADC 512 of the second ADC stage 510 detects that the ADC 512 is saturated and outputs a saturation signal to the control logic device 530.

When the control logic device 530 receives the saturation signal from the saturation detector SAT of the ADC 512 of the second ADC stage 510, it outputs an enable signal to the enable input EN of the first ADC stage 500 and the switch 533 of the first bypass line 531. The enable signal switches on the first ADC stage 500 and opens the switch 533 of the first bypass line 531 to disable the first bypass line 531, with the result that the input analogue signal stops passing directly to the input of the SHA 511 of the second ADC stage 510 and instead passes directly to the input of the SHA 501 of the first ADC stage 500. The SHA 501 and ADC 502 of the first ADC stage 500 convert the input analogue signal from analogue to digital and output the converted signal $N_1$ to the control logic device 530 and to the DAC 503. The DAC 503 converts output of the ADC 502 back to an analogue signal and outputs the reconverted analogue signal to the subtractor 504. The subtractor 504 then subtracts the reconverted analogue signal from the input analogue signal passed to it from the SHA 501. The signal resulting from the subtraction is passed to the input of the second ADC stage 510, which performs analogue to digital conversion of the signal and outputs the converted signal $N_2$ to the control logic device 530 and passes the signal output by the its subtractor 514 to the third ADC stage 520, which performs analogue to digital conversion of the signal and outputs the converted signal $N_3$ to the control logic device 530.

The control logic device 530 receives the outputs $N_1$, $N_2$, $N_3$ of the ADCs 502, 512, 522 of each ADC stage 500, 510, 520. When the control logic device 530 is not outputting the enable signal to either the first ADC stage 500 or the second ADC stage, the output of the ADC unit 208, 210 is only the output $N_3$ of the third ADC stage 520; when the control logic device is outputting the enable signal to the second ADC stage 510, but not to the first ADC stage 500, the output of the ADC unit 208, 210 is the combined outputs $N_2$, $N_3$ of second and third ADC stages 510, 520; and when the control logic device is outputting the enable signal to both the first ADC stage 500 and the second ADC stage 510, the output of the ADC unit 208, 210 is the combined outputs $N_1$, $N_2$, $N_3$ of first, second and third ADC stages 500, 510, 520. When the outputs $N_1$, $N_2$, $N_3$ are combined, the output $N_3$ of the third ADC stage 520 forms the least significant bits, the output $N_2$ of the second ADC stage 510 forms the next least significant bits and the output $N_1$ of the first ADC stage 500 forms the most significant bits of the combined signal.

It will be appreciated that, whilst the second and third ADC stages 510, 520 momentarily become saturated as the amplitude of input analogue signal increases to reach the top of their dynamic ranges, i.e. 60 dB and 40 dB respectively, as soon as the first or second ADC stages 500, 510 are switched on, as appropriate, the saturation of the second or third ADC stages 510, 520 ceases. So, like the second embodiment of the ADC units 208, 210, although the control logic device 530 is prompted to output the enable signal(s) to the first and second ADC stages 500, 510 when it receives the saturation signal(s) from the ADCs 512, 522 of the second and third ADC stages 510, 520, the control logic device 530 continues to output the enable signal(s) regardless of whether or not it continues to receive the saturation signal(s). The control logic device 530 decides when to stop outputting the enable signal(s) by monitoring the output of the ADC 502 of the first ADC stage 500 or the ADC 512 of the second ADC stage 510, as appropriate. More specifically, when the second ADC stage 510 is turned on, but the first ADC stage 500 is not, the control logic device 530 monitors the combined output of the second ADC stage 510 and the third ADC stage 520 and stops outputting the enable signal to the second ADC stage 510 if the combined output continues to represent an input analogue signal with an amplitude of less than 40 dB for more than a given period, e.g. a few ms. Similarly, when both the first and second ADC stages 500, 510 are turned on, the control logic device 530 monitors the combined output of the first, second and third ADC stages 500, 510, 520 and stops outputting the enable signal to the first ADC stage 500 if the combined output continues to represent an input analogue signal with an amplitude of less than 60 dB for more than the given period. This means that the first ADC stage 500 and the second ADC stage 510 are switched off when the signal has been below 60 dB or 40 dB respectively for the given period.

In the present specification and claims the word "a" or "an" preceding an element does not exclude the presence of a plurality of such elements. Further, the word "comprising" does not exclude the presence of other elements or steps than those listed.

The inclusion of reference signs in parentheses in the claims is intended to aid understanding and is not intended to be limiting.

The described embodiments of the invention are only examples of how the invention may be implemented. Modifications, variations and changes to the described embodiments will occur to those having appropriate skills and knowledge. These modifications, variations and changes may be made without departure from the spirit and scope of the invention defined in the claims and its equivalents.

The invention claimed is:

1. An apparatus for converting an input analogue signal to a digital output, the apparatus comprising:
a first analogue to digital converter having a first dynamic, range, the first analogue digital converter arranged
to receive the input analogue signal,
to respond to an active state by converting the input analogue signal into a digital signal by enabling power-consuming circuitry, and
to reduce, in response to an inactive state, power consumption of the power-consuming circuitry by disabling the power-consuming circuitry;
a second analogue to digital converter having a second dynamic range that is less than the first dynamic range and that is arranged
to receive the input analogue signal, and
to convert the input analogue signal into a digital signal; and
an activation circuit for activating, in response to detecting that the input analogue signal has an amplitude exceeding a threshold level, the first of the analogue to digital converters transitioning the first analogue to digital converter from the inactive state to the active state.

2. The apparatus of claim 1, wherein the threshold level is substantially the amplitude at which the second analogue to digital converter becomes saturated by the input analogue signal.

3. The apparatus of claim 1, wherein the threshold level is a fraction below the amplitude at which the second analogue to digital converter becomes saturated by the input analogue signal.

4. The apparatus of claim 3, wherein the fraction is around 20% or less.

5. The apparatus of claim 1, wherein the activation circuit comprises a detector for detecting when the input analogue signal has an amplitude exceeding the threshold level and generating a signal indicative of such detection.

6. The apparatus of claim 5, wherein the first analogue to digital converter has an enable input for receiving a signal to activate the converter and the activation circuit comprises a connection directly from the detector to the enable input so that the signal generated by the detector can activate the converter.

7. The apparatus of claim 5, wherein the activation circuit comprises a controller for outputting an enable signal to an enable input of the first analogue to digital converter to activate the first analogue to digital converter and the controller is connected to receive the signal generated by the detector
wherein the controller outputs the enable signal from whenever the signal generated by the detector indicates that the input analogue signal has an amplitude exceeding the threshold level until the controller determines that the amplitude of the input analogue signal is small enough to be converted to a digital output by the second analogue to digital converter without saturation.

8. The apparatus of claim 5, wherein the activation circuit comprises a controller for outputting an enable signal to an enable input of the first analogue to digital converter to activate the first analogue to digital converter and the controller is connected to receive the signal generated by the detector wherein the controller outputs the enable signal whenever the signal generated by the detector indicates that the input analogue signal has an amplitude exceeding the threshold level and for a period of time after the signal generated by the detector ceases to indicate that the input analogue signal has an amplitude exceeding the threshold level.

9. The apparatus of claim 1, wherein the first analogue to digital converter has a higher resolution than the second analogue to digital converter.

10. The apparatus of claim 1, comprising a selector for selecting an output of the activated analogue to digital converter having the highest dynamic range as the digital output of the apparatus.

11. The apparatus of claim 1, wherein each of the analogue to digital converters have substantially the same resolution.

12. The apparatus of claim 1, comprising a combining circuit for combining the outputs of the activated analogue to digital converters as the digital output of the apparatus.

13. A radio receiver comprising an apparatus as claimed in claim 12.

14. A multi-stage pipelined analogue to digital conversion unit comprising the apparatus of claim 1.

15. A radio receiver comprising a multi-stage pipelined analogue to digital conversion unit as claimed in claim 14.

16. The apparatus of claim 1, comprising a third analogue to digital converter having a lower dynamic range than the second analogue to digital converter and wherein the activation circuit is arranged to activate the second analogue to digital converter when the input analogue signal has an amplitude exceeding another threshold level.

17. A method of converting an input analogue signal to a digital output using two or more analogue to digital converters, a first of the analogue to digital converters including circuitry that, when activated, is arranged to convert the input analogue signal to a digital signal, the first of the analog to digital converters having a higher dynamic range than a dynamic range of a second of the analogue to digital converters, each of the analogue to digital converters arranged to receive the analogue input signal, the method comprising:
    detecting that the input analogue signal has an amplitude exceeding a threshold level and in response thereto,
        converting the input analogue signal to a digital signal using the second of the analogue to digital converters;
        deactivating the circuitry of first of the analogue to digital converters by disabling power consumption of the circuitry; and
    detecting that the input analogue signal has an amplitude exceeding a threshold level and in response thereto,
    activating the circuitry of the first of the analogue to digital converters by enabling power consumption of the circuitry, wherein, after activation, the first and the second analogue to digital converters each convert the input analogue signal into a digital signal.

18. The method of claim 17, wherein the threshold level is substantially the amplitude at which the second analogue to digital converter becomes saturated by the input analogue signal.

19. The method claim 17, wherein the threshold level is a fraction below the amplitude at which the second analogue to digital converter becomes saturated by the input analogue signal.

20. The method of claim 19, wherein the fraction is around 20% or less.

21. The method of claim 17, comprising detecting when the input analogue signal has an amplitude exceeding the threshold level and generating a signal indicative of such detection.

22. The method of claim 21, wherein the first analogue to digital converter has an enable input for receiving a signal to activate the converter and the method comprises outputting the signal indicative of the detection directly to the enable input so that the signal can activate the converter.

23. The method of claim 21, comprising outputting an enable signal to an enable input of the first analogue to digital converter to activate the first analogue to digital converter from whenever the generated signal indicates that the input analogue signal has an amplitude exceeding the threshold level until determining that the amplitude of the input analogue signal is small enough to be converted to a digital output by the second analogue to digital converter without saturation.

24. The method of claim 21, comprising outputting an enable signal to an enable input of the first analogue to digital converter to activate the first analogue to digital converter whenever the generated signal indicates that the input analogue signal has an amplitude exceeding the threshold level and for a period of time after the generated signal ceases to indicate that the input analogue signal has an amplitude exceeding the threshold level.

25. The method of claim 17, wherein the first analogue to digital converter has a higher resolution than the second analogue to digital converter.

26. The method of claim 17, comprising selecting an output of the activated analogue to digital converter having the highest dynamic range as the digital output.

27. The method of claim 17, wherein each of the analogue to digital converters have substantially the same resolution.

28. The method of claim 17, comprising combining the outputs of the switched on analogue to digital converters as the digital output.

29. The method of claim 17, using a third analogue to digital converter having a lower dynamic range than the second analogue to digital converter and comprising activating the second analogue to digital converter when the input analogue signal has an amplitude exceeding another threshold level.

30. A tangible storage medium storing computer program code for carrying out the method of claim 17 when processed by a computer processor.

* * * * *